United States Patent
Chang et al.

(10) Patent No.: US 8,223,109 B2
(45) Date of Patent: Jul. 17, 2012

(54) GATE DRIVING CIRCUIT HAVING A LOW LEAKAGE CURRENT CONTROL MECHANISM

(75) Inventors: Lee-Hsun Chang, Hsin-Chu (TW); Wen-Pin Chen, Hsin-Chu (TW); Je-Hao Hsu, Hsin-Chu (TW); Chiu-Mei Yu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 889 days.

(21) Appl. No.: 12/330,523

(22) Filed: Dec. 9, 2008

(65) Prior Publication Data

US 2010/0085083 A1 Apr. 8, 2010

(30) Foreign Application Priority Data

Oct. 8, 2008 (TW) .............................. 97138667 A

(51) Int. Cl.
*G09G 3/36* (2006.01)
(52) U.S. Cl. ....................................................... 345/100
(58) Field of Classification Search ............. 345/87–104
See application file for complete search history.

(56) References Cited

U.S. PATENT DOCUMENTS

| 7,764,761 B2 * | 7/2010 | Shih et al. ........................ 377/64 |
| 2004/0189585 A1 * | 9/2004 | Moon ............................ 345/100 |
| 2005/0220262 A1 * | 10/2005 | Moon ............................... 377/64 |
| 2005/0248379 A1 | 11/2005 | Arima |
| 2008/0100560 A1 * | 5/2008 | Na et al. ......................... 345/101 |

\* cited by examiner

*Primary Examiner* — Jimmy H Nguyen
(74) *Attorney, Agent, or Firm* — Winston Hsu; Scott Margo

(57) ABSTRACT

A gate driving circuit having a low leakage current control mechanism is disclosed for providing a plurality of gate signals forwarded to a plurality of gate lines respectively. The gate driving circuit includes a plurality of shift registers. Each shift register includes a driving unit, an energy store unit, a buffer unit, a voltage regulation unit, and a control unit. The driving unit generates a gate signal based on a driving control voltage and a first clock. The buffer unit functions to receive a start pulse signal. The energy store unit provides the driving control voltage through performing a charging process based on the start pulse signal. The control unit generates a control signal based on the first clock and a second clock having a phase opposite to the first clock. The voltage regulation unit regulates the driving control voltage based on the control signal.

18 Claims, 8 Drawing Sheets

GATE DRIVING CIRCUIT HAVING A LOW LEAKAGE CURRENT CONTROL MECHANISM

BACKGROUND OF THE INVENTION

1. Field of the Invention

The present invention relates to a gate driving circuit, and more particularly, to a gate driving circuit having a low leakage current control mechanism.

2. Description of the Prior Art

Because the liquid crystal display (LCD) has advantages of thin appearance, low power consumption, and low radiation, the liquid crystal display has been widely applied in various electronic products for panel displaying. The operation of a liquid crystal display is featured by varying voltage drops between opposite sides of a liquid crystal layer for twisting the angles of the liquid crystal molecules in the liquid crystal layer so that the transparency of the liquid crystal layer can be controlled for illustrating images with the aid of the light source provided by a backlight module.

In general, the liquid crystal display comprises a plurality of pixel units, a gate driving circuit and a source driving circuit. The source driving circuit is utilized for providing a plurality of data signals to be written into the pixel units. The gate driving circuit comprises a plurality of shift registers and functions to provide a plurality of gate driving signals for controlling related writing operations of the pixel units. That is, the gate driving circuit is a key device for providing a control of writing the data signals into the pixel units.

FIG. 1 is a schematic diagram showing a prior-art gate driving circuit. As shown in FIG. 1, for ease of explanation, the gate driving circuit 100 illustrates only an Nth shift register 110. The Nth shift register 110 is employed to generate a gate signal SGn and a start pulse signal STn according to a first clock CK1, a second clock CK2 and a start pulse signal STn−1. The start pulse signal STn is forwarded to another shift register following the Nth shift register 110. The gate signal SGn is furnished to a pixel unit 105 of a pixel array 101 via a gate line GLn so as to control a writing operation for writing the data signal of the data line DLi into the pixel unit 105. The Nth shift register 110 comprises a driving unit 120, an energy store unit 130, a buffer unit 140, a carry unit 170 and a plurality of transistors 191-193. The energy store unit 130 is used to generate a driving control voltage VQn through performing a charging process based on the start pulse signal STn−1 received by the buffer unit 140. The driving unit 120 makes use of the driving control voltage VQn and the first clock CK1 for generating the gate signal SGn outputted to the gate line GLn.

However, in the process of generating the gate signal SGn by the Nth shift register enabled, when the driving unit 120 is working for generating the gate signal SGn having high-level voltage based on the driving control voltage VQn and the first clock CK1 having high-level voltage, the transistor 193 is turned on by the first clock CK1 having high-level voltage; in turn, the driving control voltage VQn is decreasing because of a discharging process occurring to the energy store unit 130 resulting from a leakage current flowing through the transistor 193. As the driving control voltage VQn is decreased, the driving signal SGn generated by the driving unit 120 may be unable to reach a voltage high enough for driving the pixel unit 105 to perform an accurate data signal writing operation, which is likely to reduce image display quality.

SUMMARY OF THE INVENTION

In accordance with an embodiment of the present invention, a gate driving circuit for providing a plurality of gate signals to a plurality of gate lines is disclosed. The gate driving circuit comprises a plurality of shift registers. Each shift register comprises a driving unit, a buffer unit, an energy store unit, a voltage regulation unit and a control unit.

The driving unit is electrically coupled to a corresponding gate line and functions to generate a corresponding gate signal based on a driving control voltage and a first clock. The buffer unit is employed to receive an input signal. The energy store unit, electrically coupled to the driving unit and the buffer unit, is put in use for providing the driving control voltage to the driving unit through performing a charging process based on the input signal. The voltage regulation unit, electrically coupled to the energy store unit, is utilized for regulating the driving control voltage based on a control signal. The control unit, electrically coupled to the voltage regulation unit, is employed to generate the control signal based on the first clock and a second clock having a phase opposite to the first clock.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
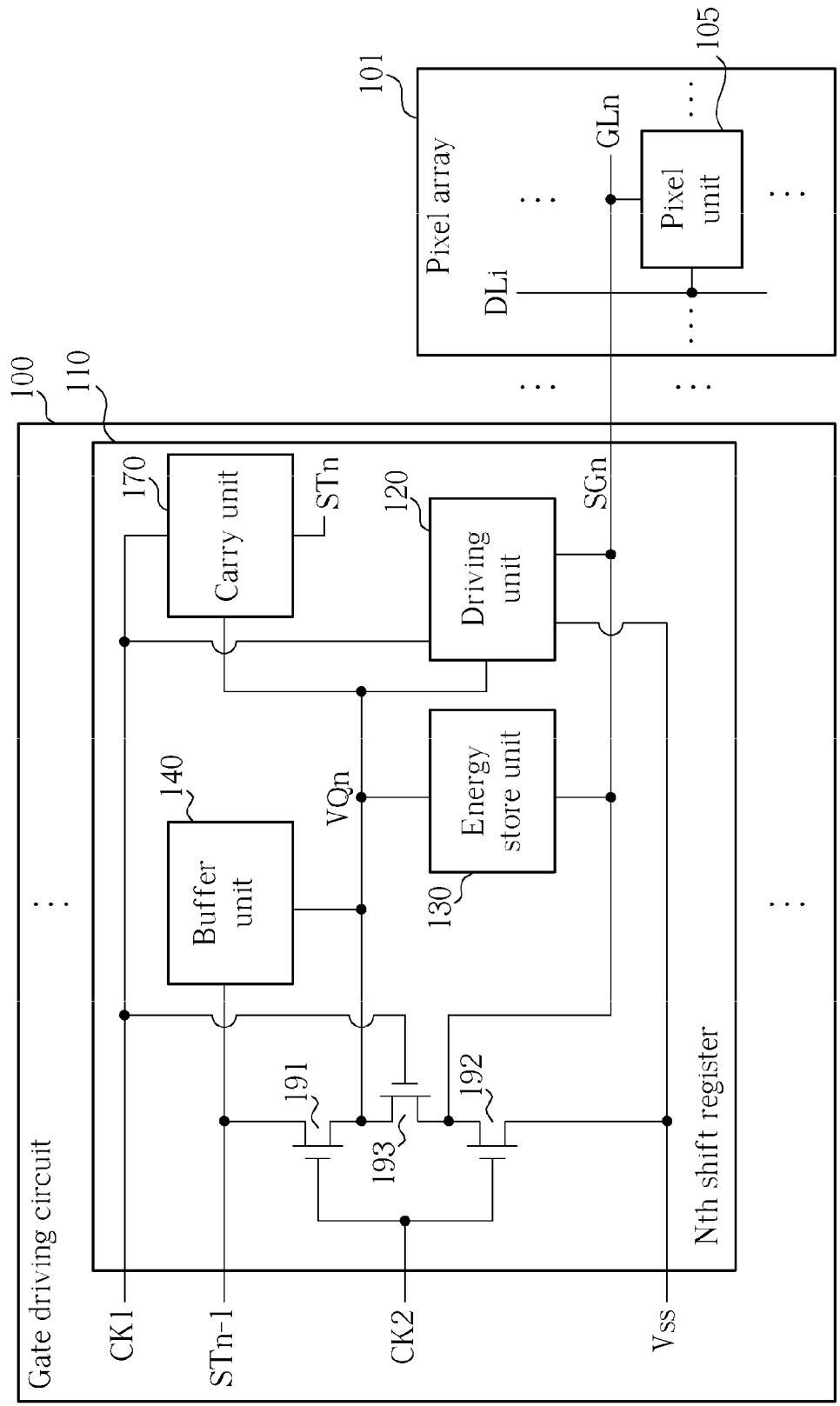
FIG. 1 is a schematic diagram showing a prior-art gate driving circuit.
Figure 2:
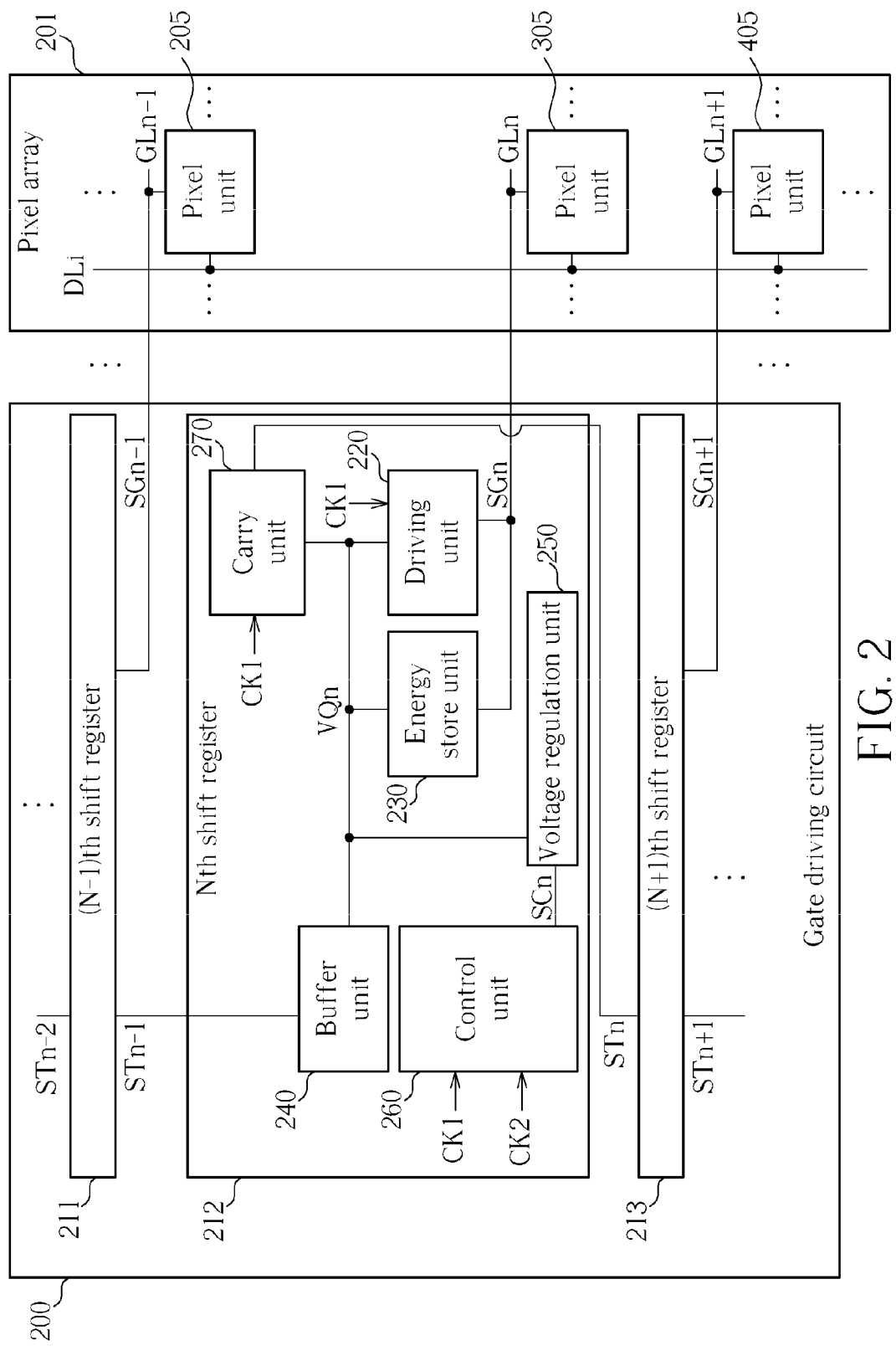
FIG. 2 is a functional block diagram schematically showing a gate driving circuit in accordance with a first embodiment of the present invention.

FIG. 2 is a functional block diagram schematically showing a gate driving circuit in accordance with a first embodiment of the present invention. As shown in FIG. 2, the gate driving circuit 200 comprises a plurality of shift registers and, for ease of explanation, illustrates only a (N−1)th shift register 211, an Nth shift register 212 and a (N+1)th shift register 213. For sake of brevity, only the function units regarding the internal structure of the Nth shift register 212 are exemplified. The (N−1)th shift register 211 is employed to provide a gate signal SGn−1 and a start pulse signal STn−1. The Nth shift register 212 is employed to provide a gate signal SGn and a start pulse signal STn. The (N+1)th shift register 213 is employed to provide a gate signal SGn+1 and a start pulse signal STn+1. The gate signal SGn−1 is furnished to a pixel unit 205 of a pixel array 201 via a gate line GLn−1 so as to control a writing operation of the pixel unit 205 for writing a corresponding data signal of the data line DLi into the pixel unit 205. The gate signal SGn is furnished to a pixel unit 305 of the pixel array 201 via a gate line GLn so as to control a writing operation of the pixel unit 305 for writing a corresponding data signal of the data line DLi into the pixel unit 305. The gate signal SGn+1 is furnished to a pixel unit 405 of the pixel array 201 via a gate line GLn+1 so as to control a writing operation of the pixel unit 405 for writing a corresponding data signal of the data line DLi into the pixel unit 405.

The Nth shift register 212 comprises a driving unit 220, an energy store unit 230, a buffer unit 240, a voltage regulation unit 250, a control unit 260 and a carry unit 270. The driving unit 220 is coupled to the gate line GLn and functions to generate the gate signal SGn based on a driving control voltage VQn and a first clock CK1. The buffer unit 240 is coupled to the (N−1)th shift register 211 for receiving the start pulse signal STn−1. The energy store unit 230, coupled to the driving unit 220 and the buffer unit 240, is utilized for performing a charging process based on the start pulse signal STn−1 so as to generate the driving control voltage VQn furnished to the driving unit 220. The control unit 260 functions to generate a control signal SCn based on the first clock CK1 and a second clock CK2. The first clock CK1 and the second clock CK2 have 180° phase shift relative to each other. It is therefore noted that, in the following description, the second clock CK2 has a high-level voltage provided that the first clock CK1 has a low-level voltage, and vice versa. The voltage regulation unit 250, coupled to the energy store unit 230 and the control unit 260, is employed to regulate the driving control voltage VQn based on the control signal SCn.

The carry unit 270 is coupled to the energy store unit 230 and functions to generate the start pulse signal STn according to the driving control voltage VQn and the first clock CK1. In another embodiment, the carry unit 270 is omitted and the buffer unit 240 receives the gate signal SGn−1 from the (N−1)th shift register 211; in turn, the energy store unit 230 performs a charging process based on the gate signal SGn−1 so as to generate driving control voltage VQn furnished to the driving unit 220. Accordingly, only a gate signal is generated by each shift register, i.e. no start pulse signal is generated, and the gate signal is forwarded to both the pixel array 201 and a following shift register. In other words, the gate signal, other than controlling data signal writing operations, is also used as a start pulse signal for enabling the following shift register.

Figure 3:
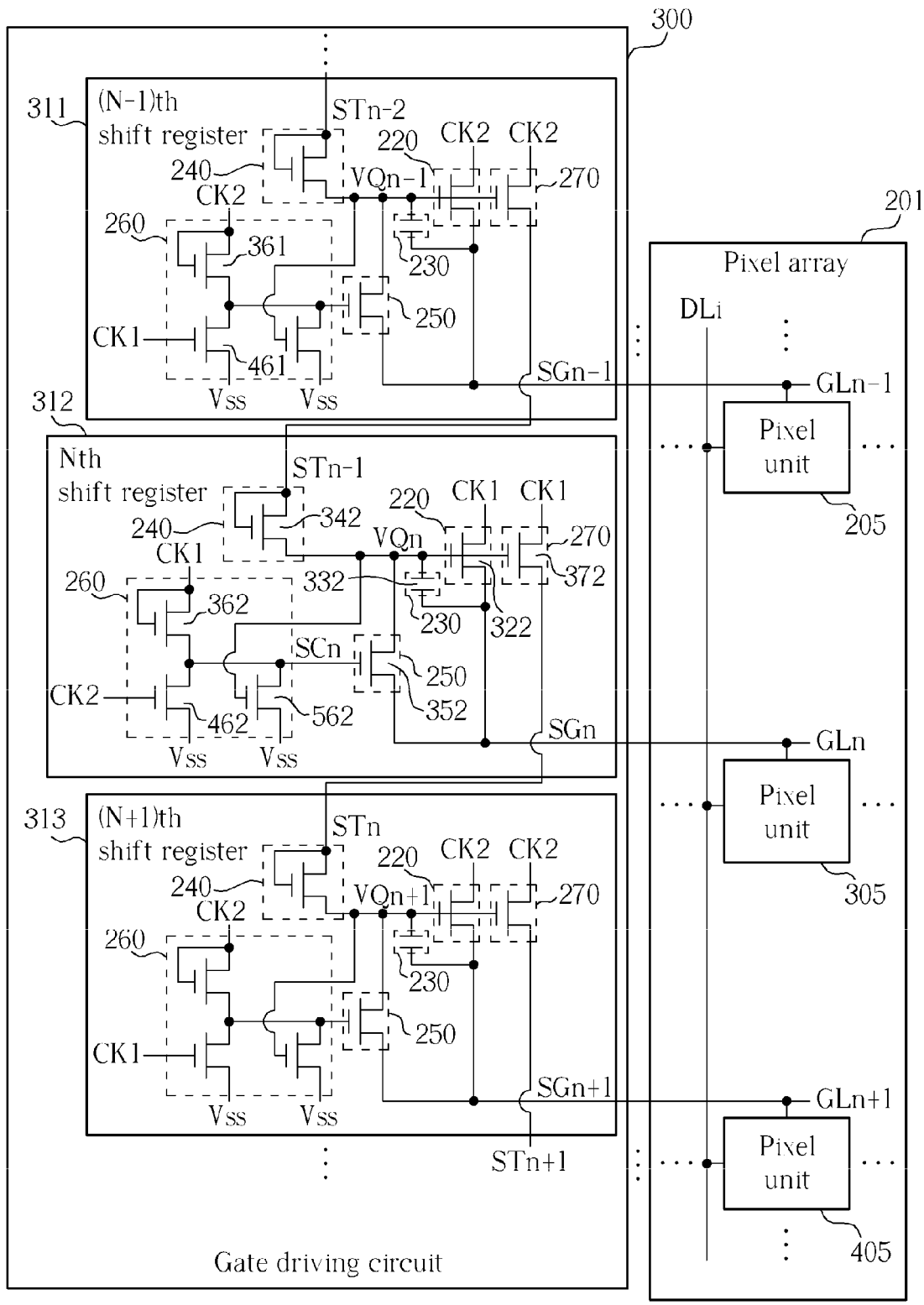
FIG. 3 is a circuit diagram schematically showing a gate driving circuit in accordance with a second embodiment of the present invention.

FIG. 3 is a circuit diagram schematically showing a gate driving circuit in accordance with a second embodiment of the present invention. As shown in FIG. 3, the gate driving circuit 300 comprises a plurality of shift registers and, for ease of explanation, illustrates only a (N−1)th shift register 311, an Nth shift register 312 and a (N+1)th shift register 313. Each shift register includes all the function units of the Nth shift register 212 shown in FIG. 2.

Take the Nth shift register 312 for instance, the buffer unit 240 comprises a buffer transistor 342, the driving unit 220 comprises a first switch 322, the voltage regulation unit 250 comprises a second switch 352, the carry unit 270 comprises a third switch 372, the energy store unit 230 comprises a capacitor 332, and the control unit 260 comprises a first transistor 362, a second transistor 462 and a third transistor 562. The first switch 322, the second switch 352 and the third switch 372 can be thin film transistors, metal oxide semiconductor (MOS) field effect transistors, or junction field effect transistors. Also, the buffer transistor 342, the first transistor 362, the second transistor 462 and the third transistor 562 can be thin film transistors, MOS field effect transistors, or junction field effect transistors.

The first switch 322 comprises a first end for receiving the first clock CK1, a gate for receiving the driving control voltage VQn, and a second end for outputting the gate signal SGn. The capacitor 332 is coupled between the gate and the second end of the first switch 322. The buffer transistor 342 comprises a first end for receiving the start pulse signal STn−1 outputted from the carry unit 270 of the (N−1)th shift register 311, a gate coupled to the first end, and a second end coupled to the capacitor 332. Accordingly, the capacitor 332 is used to generate the driving control voltage VQn through performing a charging process based on the start pulse signal STn−1 received by the buffer transistor 342. The third switch 372 comprises a first end for receiving the first clock CK1, a gate for receiving the driving control voltage VQn, and a second end for outputting the start pulse signal STn.

The second switch 352 comprises a first end coupled to the capacitor 332, a gate for receiving the control signal SCn, and a second end coupled to the second end of the first switch 322. The first transistor 362 comprises a first end for receiving the first clock CK1, a gate coupled to the first end, and a second end coupled to the gate of the second switch 352. The second transistor 462 comprises a first end coupled to the second end of the first transistor 362, a gate for receiving the second clock CK2, and a second end for receiving a low power voltage Vss. The third transistor 562 comprises a first end coupled to the gate of the second switch 352, a gate for receiving the driving control voltage VQn, and a second end for receiving the low power voltage Vss.

It is noted that, in the (N−1)th shift register 311, the carry unit 270 is employed to generate the start pulse signal STn−1 based on the driving control voltage VQn−1 and the second clock CK2, the driving unit 220 is used to generate the gate signal SGn−1 based on the driving control voltage VQn−1 and the second clock CK2, the first end of the first transistor 361 of the control unit 260 is utilized for receiving the second clock CK2, and the gate of the second transistor 461 of the control unit 260 is utilized for receiving the first clock CK1. Other shift registers, such as the (N+1)th shift register 313, can be inferred by analogy.

The circuit operation of the Nth shift register 312 is detailed as the followings. Before the Nth shift register 312 is enabled, both the start pulse signal STn−1 and the gate signal SGn are low-level signals, and therefore the buffer transistor 342 is turned off. Under such situation, if the first clock CK1 has a low-level voltage, the second switch 352 is also turned off, and for that reason, the gate of the first switch 322 is then floated. That is, the driving control voltage VQn becomes a floating voltage. When the first clock CK1 is switching from a low-level voltage to a high-level voltage, the driving control voltage VQn will be boosted due to a capacitive coupling effect caused by the device capacitors of the first switch 322 and the third switch 372. Furthermore, the high-level voltage of the first clock CK1 is furnished to the gate of second switch 352 via the first transistor 362, and the second switch 352 is then turned on for pulling down the driving control voltage VQn to the low voltage level of the gate signal SGn. Thereafter, when the first clock CK1 is switching to the low-level voltage, the second clock CK2 is switching to the high-level voltage, and the second transistor 462 is then turned on for pulling down the voltage at the gate of the second switch 352 to the low power voltage Vss. Accordingly, the second switch 352 is turned off for retaining the low voltage level of the driving control voltage VQn.

In a process during which the Nth shift register 312 is enabled, the start pulse signal STn−1 is firstly rising to become a high-level signal, and therefore the buffer transistor 342 is turned on so that the start pulse signal STn−1 can be employed to charge the capacitor 332 for boosting the driving control voltage VQn to a first high voltage. When the start pulse signal STn−1 is switching from the high-level signal to a low-level signal, the buffer transistor 342 is then turned off; meanwhile, the first clock CK1 is switching from a low-level voltage to a high-level voltage and the driving control voltage VQn is boosted from the first high voltage to a second high voltage; in turn, the first switch 322 and the third switch 372 are turned on for outputting the first clock CK1 having the high-level voltage to be the gate signal SGn and the start pulse signal STn. Furthermore, the driving control voltage VQn having the second high voltage is also employed to turn on the third transistor 562, and for that reason, the second switch 352 is turned off so as to avoid reducing the driving control voltage VQn caused by a leakage of charges stored in the capacitor 332 via the second switch 352.

Figure 4:
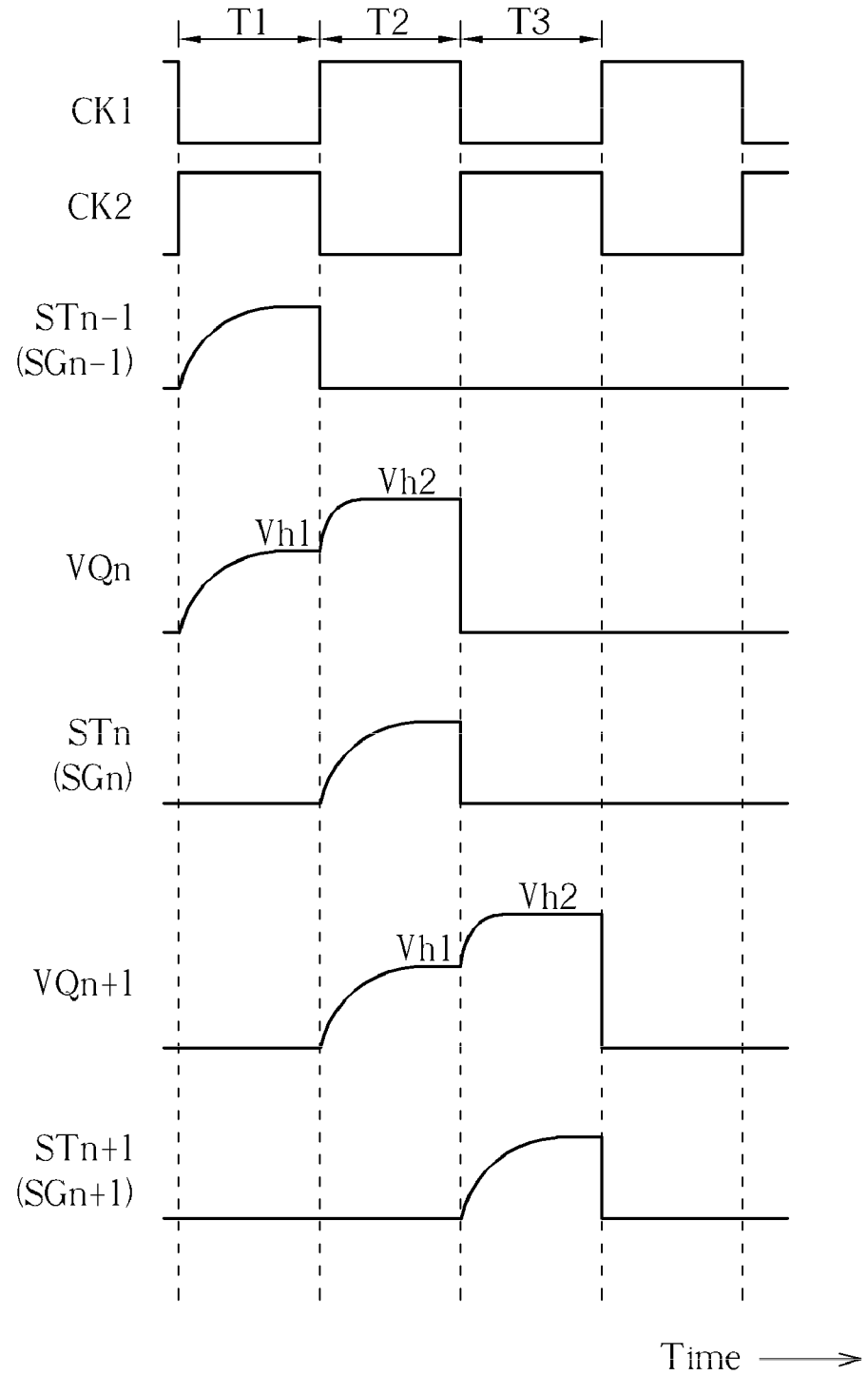
FIG. 4 shows the related signal waveforms regarding the operation of the gate driving circuit in FIG. 3, having time along the abscissa.

FIG. 4 shows the related signal waveforms regarding the operation of the gate driving circuit in FIG. 3, having time along the abscissa. The signal waveforms in FIG. 4, from top to bottom, are the first clock CK1, the second clock CK2, the start pulse signal STn−1 (the gate signal SGn−1), the driving control voltage VQn, the start pulse signal STn (the gate signal SGn), the driving control voltage VQn+1, and the start pulse signal STn+1 (the gate signal SGn+1). The waveform of start pulse signal STn−1 is substantially identical to that of the gate signal SGn−1, and the waveforms of the other start pulse signal and corresponding gate signal are also substantially identical.

As shown in FIG. 4, during an interval T1, the start pulse signal STn−1 is rising from a low-level voltage to a high-level voltage, and then the buffer transistor 342 is turned on for boosting the driving control voltage VQn from a low voltage to a first high voltage Vh1. During an interval T2, the star pulse signal STn−1 is pulled down to the low-level voltage for turning off the buffer transistor 342, and therefore the driving control voltage VQn becomes a floating voltage. Afterwards, when the gate of the first switch 322 is floated and the first clock CK1 is switching from a low-level voltage to a high-level voltage, the driving control voltage VQn is boosted from the first high voltage Vh1 to a second high voltage Vh2 due to a capacitive coupling effect caused by the device capacitors of the first switch 322 and the third switch 372. Accordingly, the first switch 322 and the third switch 372 are turned on by the driving control voltage VQn, and the start pulse signal STn (the gate signal SGn) is then rising from a low-level voltage to a high-level voltage.

When the start pulse signal STn is rising from the low-level voltage to the high-level voltage, the driving control voltage VQn+1 is also rising from a low voltage to the first high voltage Vh1. Subsequently, during an interval T3, the driving control voltage VQn+1 is boosted from the first high voltage Vh1 to the second high voltage Vh2 based on corresponding capacitive coupling effect; meanwhile, the start pulse signal STn+1 (the gate signal SGn+1) is rising from the low-level voltage to the high-level voltage. As aforementioned, the second switch 352 is turned off in the process during which the driving control voltage VQn is rising from the low voltage to the second high voltage Vh2, and therefore the driving control voltage VQn can be ensured to reach and hold a desired high voltage without an unwanted decrease caused by a leakage of charges stored in the capacitor 332 via the second switch 352, for retaining a high-quality image display.

Figure 5:
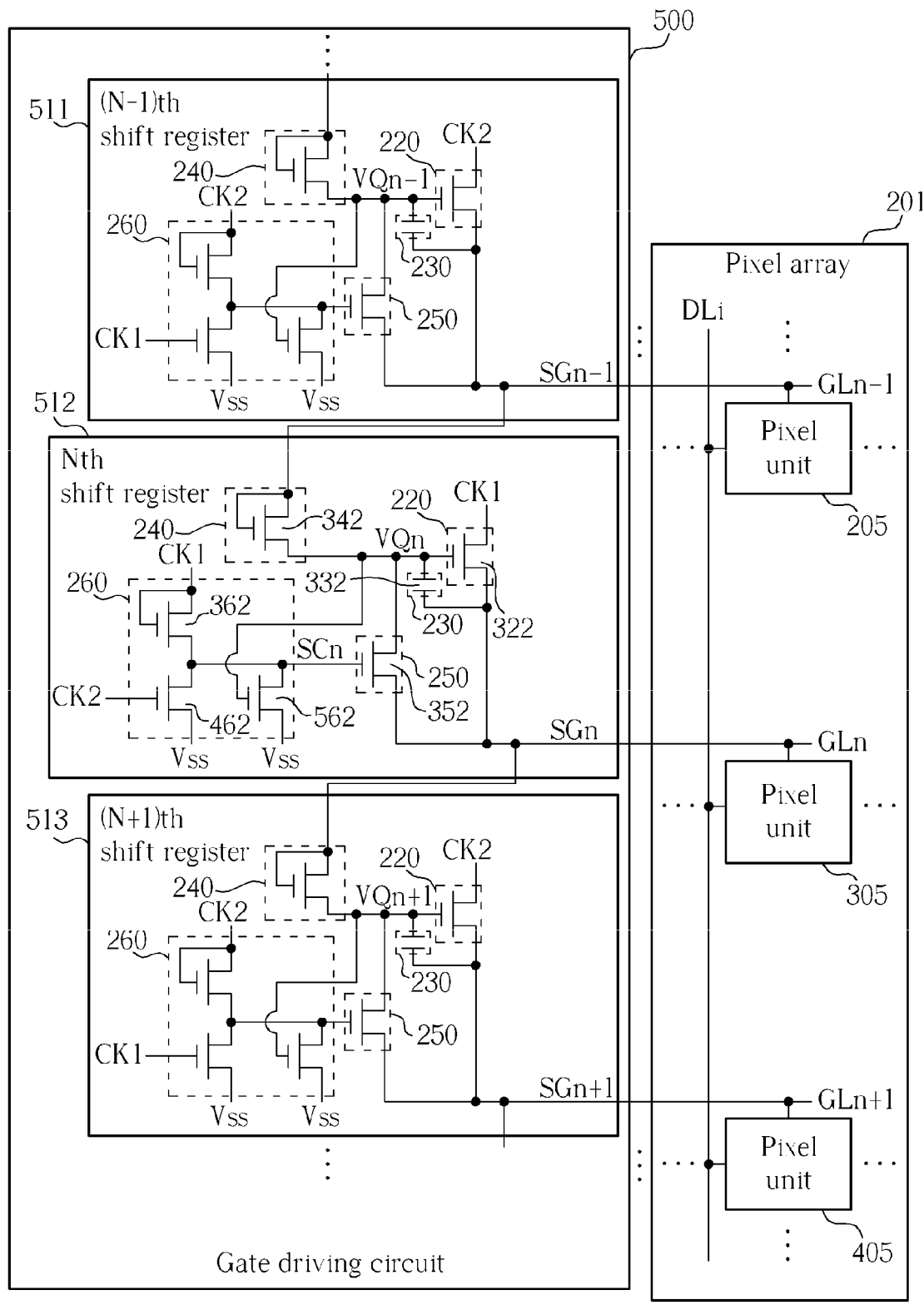
FIG. 5 is a circuit diagram schematically showing a gate driving circuit in accordance with a third embodiment of the present invention.

FIG. 5 is a circuit diagram schematically showing a gate driving circuit in accordance with a third embodiment of the present invention. As shown in FIG. 5, the gate driving circuit 500 comprises a plurality of shift registers and, for ease of explanation, illustrates only a (N−1)th shift register 511, an Nth shift register 512 and a (N+1)th shift register 513. Each shift register includes the plurality of function units of the Nth shift register 212 shown in FIG. 2 except for the carry unit 270. Referring to FIG. 5, in the Nth shift register 512, the first end of the buffer transistor 342 is coupled to the driving unit 220 of the (N−1)th shift register 511 for receiving the gate signal SGn−1, and therefore the gate signal SGn−1 is also used as a start pulse signal for enabling the Nth shift register 512. Other shift registers, such as the (N−1)th shift register 511 and the (N+1)th shift register 513, can be inferred by analogy. That is, the internal structure and related coupling relationships of each shift register in FIG. 5 are similar to those of the Nth shift register 312 in FIG. 3, differing only in that the carry unit 270 is omitted and the gate signal is also used as a start pulse signal. Besides, the related signal waveforms regarding the operation of the gate driving circuit 500 are identical to the signal waveforms shown in FIG. 4, and for the sake of brevity, further similar discussion thereof is omitted.

Figure 6:
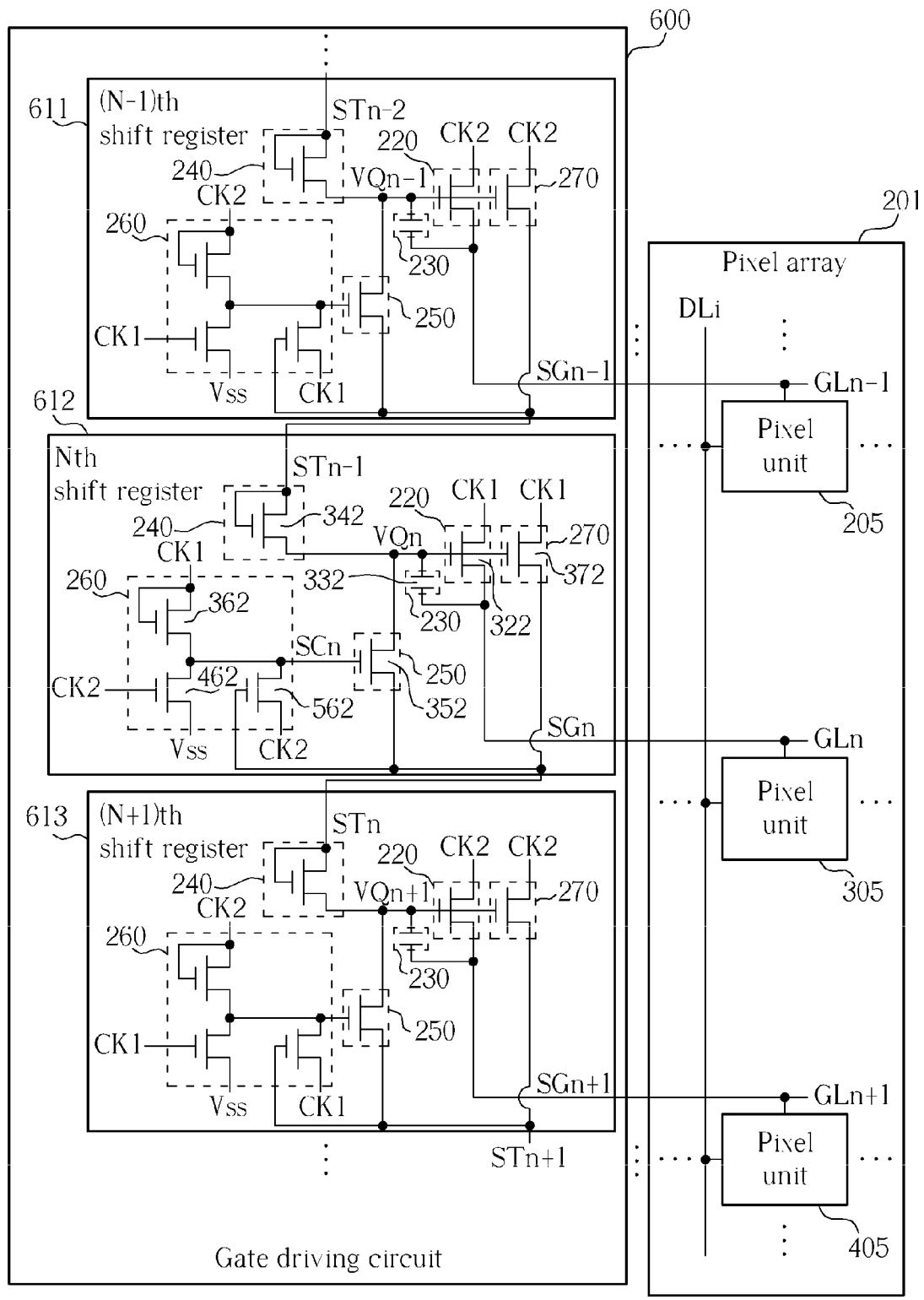
FIG. 6 is a circuit diagram schematically showing a gate driving circuit in accordance with a fourth embodiment of the present invention.

FIG. 6 is a circuit diagram schematically showing a gate driving circuit in accordance with a fourth embodiment of the present invention. As shown in FIG. 6, the gate driving circuit 600 comprises a plurality of shift registers and, for ease of explanation, illustrates only a (N−1)th shift register 611, an Nth shift register 612 and a (N+1)th shift register 613. Each shift register includes all the function units of the Nth shift register 212 shown in FIG. 2. Referring to FIG. 6, in the Nth shift register 612, both the gate of third transistor 562 and the second end of the second switch 352 are coupled to the second end of the third switch 372, and the second end of the third transistor 562 is employed to receive the second clock CK2. Other shift registers, such as the (N−1)th shift register 611 and the (N+1)th shift register 613, can be inferred by analogy. Except for the abovementioned internal coupling relationships of each shift register in the gate driving circuit 600, other internal coupling relationships of each shift register in FIG. 6 are similar to those of the Nth shift register 312 in FIG. 3. Besides, the related signal waveforms regarding the operation of the gate driving circuit 600 are identical to the signal waveforms shown in FIG. 4, and for the sake of brevity, further similar discussion thereof is omitted.

Figure 7:
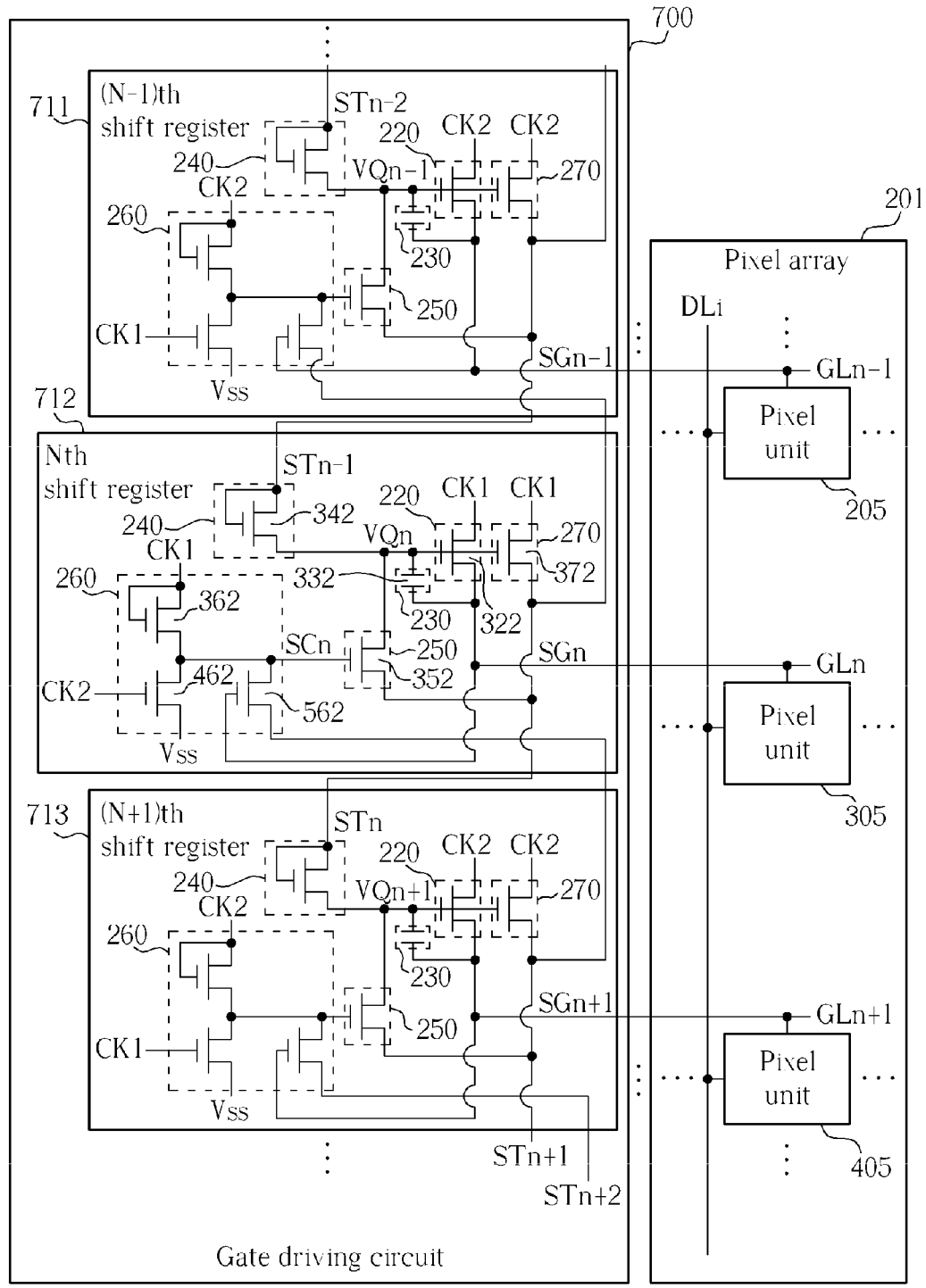
FIG. 7 is a circuit diagram schematically showing a gate driving circuit in accordance with a fifth embodiment of the present invention.

FIG. 7 is a circuit diagram schematically showing a gate driving circuit in accordance with a fifth embodiment of the present invention. As shown in FIG. 7, the gate driving circuit 700 comprises a plurality of shift registers and, for ease of explanation, illustrates only a (N−1)th shift register 711, an Nth shift register 712 and a (N+1)th shift register 713. Each shift register includes all the function units of the Nth shift register 212 shown in FIG. 2. Referring to FIG. 7, in the Nth shift register 712, the gate of the third transistor 562 is coupled to the second end of the first switch 322 for receiving the gate signal SGn, the second end of the third transistor 562 is utilized for receiving the start pulse signal STn+1 generated by the (N+1)th shift register 713, and the second end of the second switch 352 is coupled to the second end of the third switch 372 for receiving the start pulse signal STn. Other shift registers, such as the (N−1)th shift register 711 and the (N+1)th shift register 713, can be inferred by analogy. Except for the abovementioned internal coupling relationships of each shift register in the gate driving circuit 700, other internal coupling relationships of each shift register in FIG. 7 are similar to those of the Nth shift register 312 in FIG. 3. Besides, the related signal waveforms regarding the operation of the gate driving circuit 700 are identical to the signal waveforms shown in FIG. 4, and for the sake of brevity, further similar discussion thereof is omitted.

Figure 8:
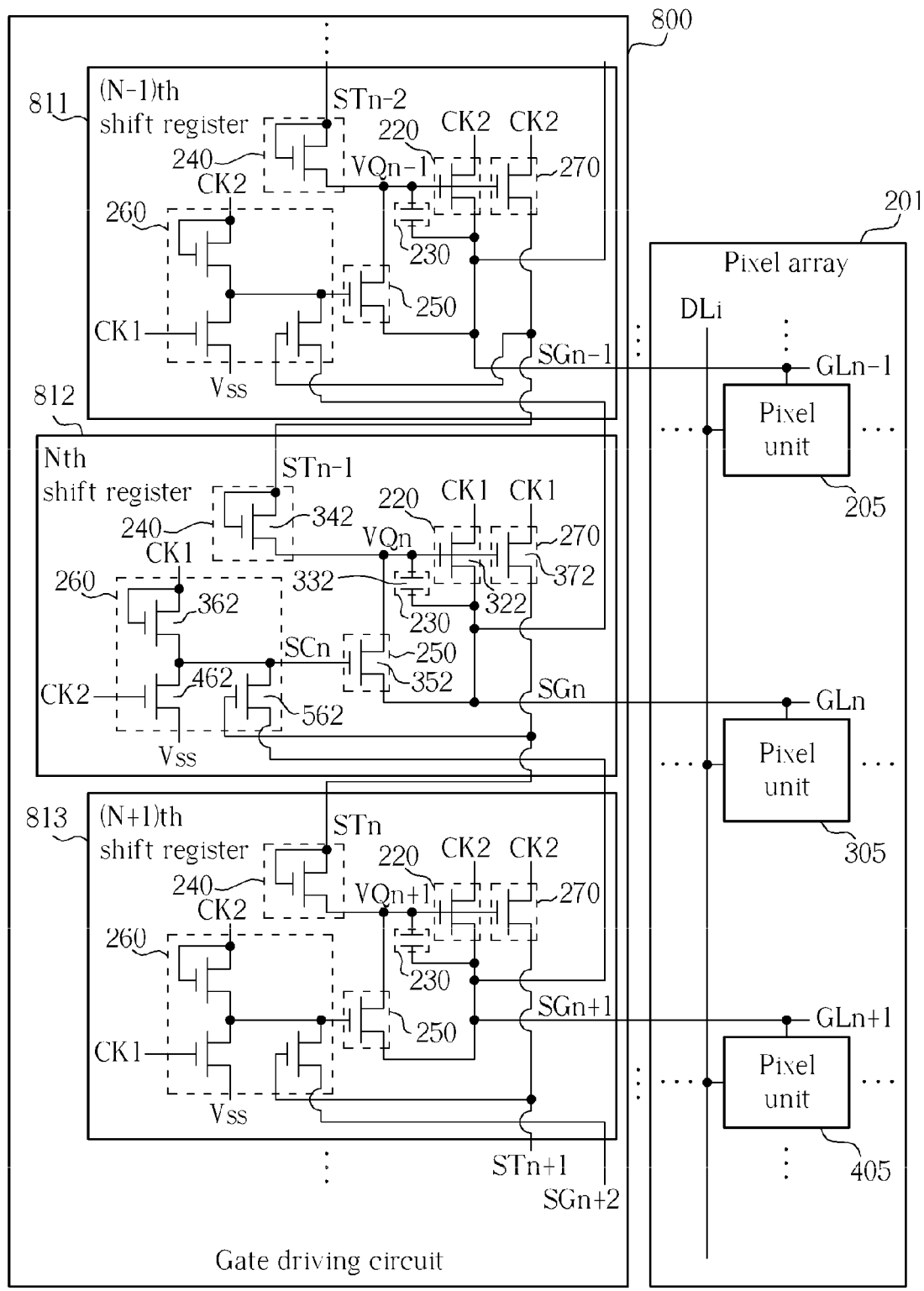
FIG. 8 is a circuit diagram schematically showing a gate driving circuit in accordance with a sixth embodiment of the present invention.

FIG. 8 is a circuit diagram schematically showing a gate driving circuit in accordance with a sixth embodiment of the present invention. As shown in FIG. 8, the gate driving circuit 800 comprises a plurality of shift registers and, for ease of explanation, illustrates only a (N−1)th shift register 811, an Nth shift register 812 and a (N+1)th shift register 813. Each shift register includes all the function units of the Nth shift register 212 shown in FIG. 2. Referring to FIG. 8, in the Nth shift register 812, the gate of the third transistor 562 is coupled to the second end of the third switch 372 for receiving the start pulse signal STn, and the second end of the third transistor 562 is employed to receive the gate signal SGn+1 generated by the (N+1)th shift register 813. Other shift registers, such as the (N−1)th shift register 811 and the (N+1)th shift register 813, can be inferred by analogy. Except for the abovementioned internal coupling relationships of each shift register in the gate driving circuit 800, other internal coupling relationships of each shift register in FIG. 8 are similar to those of the Nth shift register 312 in FIG. 3. Besides, the related signal waveforms regarding the operation of the gate driving circuit 800 are identical to the signal waveforms shown in FIG. 4, and for the sake of brevity, further similar discussion thereof is omitted.

In summary, regarding the operation of the shift registers in the gate driving circuit of the present invention, an unwanted decrease of the driving control voltage caused by an occurrence of leakage current is avoided, and therefore each enabled shift register is able to generate one corresponding gate signal having a voltage high enough for driving pixel units to write corresponding data signals accurately for achieving a high-quality image display.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A gate driving circuit for providing a plurality of gate signals to a plurality of gate lines, the gate driving circuit comprising a plurality of shift registers, an Nth shift register of the shift registers comprising:
   a driving unit, electrically coupled to an Nth gate line of the gate lines, for generating an Nth gate signal of the gate signals based on a driving control voltage and a first clock;
   a buffer unit for receiving an input signal;
   an energy store unit, electrically coupled to the driving unit and the buffer unit, for providing the driving control voltage to the driving unit through performing a charging process based on the input signal;
   a voltage regulation unit, electrically coupled to the energy store unit, for regulating the driving control voltage based on a control signal; and
   a control unit, electrically coupled to the voltage regulation unit, for generating the control signal based on the first clock and a second clock having a phase opposite to the first clock, wherein the voltage regulation unit comprises a switch, the switch comprising:
   a first end directly connected to the energy store unit;
   a gate directly connected to the control unit for receiving the control signal; and
   a second end directly connected to the Nth gate line or an Nth start pulse signal generated based on the driving control signal.

2. The gate driving circuit of claim 1, wherein the driving unit comprises a switch, the switch comprising:
   a first end for receiving the first clock;
   a gate electrically coupled to the energy store unit for receiving the driving control voltage; and
   a second end for outputting the Nth gate signal.

3. The gate driving circuit of claim 2, wherein the switch is a thin film transistor, a metal oxide semiconductor (MOS) field effect transistor, or a junction field effect transistor.

4. The gate driving circuit of claim 1, wherein the energy store unit comprises a capacitor.

5. The gate driving circuit of claim 1, wherein the buffer unit of the Nth shift register is electrically coupled to a driving unit of an (N−1)th shift register, the input signal being an (N−1)th gate signal generated by the (N−1)th shift register.

6. The gate driving circuit of claim 5, wherein the buffer unit comprises a transistor, the transistor comprising:
   a first end for receiving the (N−1)th gate signal;
   a gate electrically coupled to the first end; and
   a second end electrically coupled to the energy store unit.

7. The gate driving circuit of claim 6, wherein the transistor is a thin film transistor, a MOS field effect transistor, or a junction field effect transistor.

8. The gate driving circuit of claim 1, wherein the switch is a thin film transistor, a MOS field effect transistor, or a junction field effect transistor.

9. The gate driving circuit of claim 1, wherein the Nth shift register further comprises:
   a carry unit, electrically coupled to the energy store unit, for generating the Nth start pulse signal based on the driving control voltage and the first clock, the Nth start pulse signal being forwarded to a buffer unit of an (N+1)th shift register.

10. The gate driving circuit of claim 9, wherein the carry unit of the Nth shift register comprises a first switch, the first switch comprising:
    a first end for receiving the first clock;
    a gate electrically coupled to the energy store unit for receiving the driving control voltage; and
    a second end electrically coupled to the buffer unit of the (N+1)th shift register.

11. The gate driving circuit of claim 10, wherein the first switch and the switch are thin film transistors, MOS field effect transistors, or junction field effect transistors.

12. The gate driving circuit of claim 9, wherein the buffer unit of the Nth shift register comprises a transistor, the transistor comprising:
    a first end for receiving an (N−1)th start pulse signal generated by a carry unit of an (N−1)th shift register;
    a gate electrically coupled to the first end; and
    a second end electrically coupled to the energy store unit;
    wherein the input signal is the (N−1)th start pulse signal.

13. The gate driving circuit of claim 9, wherein the control unit comprises:
    a first transistor comprising:
    a first end for receiving the first clock;
    a gate electrically coupled to the first end; and
    a second end electrically coupled to the voltage regulation unit;

a second transistor comprising:
   a first end electrically coupled to the second end of the first transistor;
   a gate for receiving the second clock; and
   a second end for receiving a low power voltage; and
a third transistor comprising:
   a first end electrically coupled to the voltage regulation unit;
   a gate for receiving the driving control voltage; and
   a second end for receiving the low power voltage.

14. The gate driving circuit of claim 13, wherein the (N+1)th shift register is employed to generate an (N+1)th gate signal and an (N+1)th start pulse signal.

15. The gate driving circuit of claim 13, wherein the first transistor, the second transistor and the third transistor are thin film transistors, MOS field effect transistors, or junction field effect transistors.

16. The gate driving circuit of claim 1, wherein the control unit comprises:
a first transistor comprising:
   a first end for receiving the first clock;
   a gate electrically coupled to the first end; and
   a second end electrically coupled to the voltage regulation unit;
a second transistor comprising:
   a first end electrically coupled to the second end of the first transistor;
   a gate for receiving the second clock; and
   a second end for receiving a low power voltage; and
a third transistor comprising:
   a first end electrically coupled to the voltage regulation unit;
   a gate for receiving the driving control voltage; and
   a second end for receiving the low power voltage.

17. The gate driving circuit of claim 16, wherein an (N+1)th shift register of the shift registers is employed to generate an (N+1)th gate signal.

18. The gate driving circuit of claim 16, wherein the first transistor, the second transistor and the third transistor are thin film transistors, MOS field effect transistors, or junction field effect transistors.

* * * * *